United States Patent [19]
Lee et al.

[11] Patent Number: 5,796,657
[45] Date of Patent: *Aug. 18, 1998

[54] FLASH MEMORY WITH FLEXIBLE ERASING SIZE FROM MULTI-BYTE TO MULTI-BLOCK

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[*] Notice: The term of this patent shall not extend beyond the expiration date of Pat. No. 5,646,890.

[21] Appl. No.: 691,281

[22] Filed: Aug. 1, 1996

Related U.S. Application Data

[63] Continuation-in-part of Ser. No. 624,322, Mar. 29, 1996, Pat. No. 5,646,890, Ser. No. 645,630, May 14, 1996, Pat. No. 5,687,121, Ser. No. 664,639, Jun. 17, 1996, and Ser. No. 676,066, Jul. 5, 1996.

[51] Int. Cl.$^6$ ............................................ G11C 16/00
[52] U.S. Cl. .................... 365/185.11; 365/185.29; 365/185.33; 365/189.05; 365/230.03; 365/230.06; 365/230.08
[58] Field of Search .................. 365/185.11, 185.23, 365/185.29, 185.33, 189.05, 230.08, 230.03, 230.06

[56] References Cited

U.S. PATENT DOCUMENTS

| | | | |
|---|---|---|---|
| 4,811,294 | 3/1989 | Kobayashi et al. | 365/185.22 |
| 4,949,309 | 8/1990 | Rao | 365/185.33 |
| 5,047,981 | 9/1991 | Gill et al. | 365/185.33 |
| 5,105,386 | 4/1992 | Andoh et al. | 365/185.12 |
| 5,126,808 | 6/1992 | Montalvo et al. | 357/23.5 |
| 5,185,718 | 2/1993 | Rinerson et al. | 365/185 |
| 5,294,819 | 3/1994 | Simko | 257/314 |
| 5,337,281 | 8/1994 | Kobayashi et al. | 365/185.22 |
| 5,469,384 | 11/1995 | Lacey | 365/185.13 |

OTHER PUBLICATIONS

AMD Data Book/Handbook "Flash memory Products" (1996).

Atsumi, et al. "A 3.3V–only 16Mb Flash memory with Row–Decoding Scheme" (1996) *IEEE International Solid State Circuits Conference Digest*, 39, paper TP 2.6.

Nakayama, et al., "A New Decoding Scheme and Erase Sequence for 5V Only Sector Erasable Flash Memory" (1992), *IEEE Symposium on VLSI Circuits Digest of Technical Papers*, 3–2, p. 22.

*Primary Examiner*—Tan T. Nguyen
*Attorney, Agent, or Firm*—Flehr Hohbach Test Albritton & Herbert LLP

[57] ABSTRACT

A flash memory with a flexible erasing size includes a first bank of flash transistors and a second bank of flash transistors. Each bank of flash transistors forms a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline and the sources of the transistors in the second bank are all coupled to a second sourceline. A wordline decoder is coupled to the wordlines and configured to receive a wordline address signal and to decode the wordline address signal to select a wordline, where the wordline decoder includes a wordline latch configured to latch the selected wordline. A sourceline decoder is coupled to the sourcelines and configured to receive a sourceline address signal and to decode the sourceline address signal to select a sourceline, where the sourceline decoder includes a sourceline latch configured to latch the selected sourceline. A bitline decoder is coupled to the bitlines and configured to receive a bitline address signal and to decode the bitline address signal to latch a selected bitline, where the bitline decoder includes a bitline latch configured to latch the selected bitline.

11 Claims, 14 Drawing Sheets

FLASH MEMORY WITH FLEXIBLE ERASING SIZE FROM MULTI-BYTE TO MULTI-BLOCK

RELATED APPLICATIONS

This is a continuation in part of the following applications and incorporates these applications by reference:

U.S. patent application Ser. No. 08/624,322 filed on Mar. 29, 1996 now U.S. Pat. No. 5,646,890;

U.S. patent application Ser. No. 08/645,630 filed on May 14, 1996 now U.S. Pat. No. 5,687,121;

U.S. patent application Ser. No. 08/664,639 filed on Jun. 17, 1996; and

U.S. patent application Ser. No. 08/676,066 filed on Jul. 5, 1996.

FIELD

The present invention relates to a flash memory with flexible erasing size from multi-byte to multi-block. In particular, the flash memory includes latches to provide the function of a flexible erasing size.

BACKGROUND

Flash memories are receiving increased attention in the present and the future market. One reason is that data stored in a flash memory is nonvolatile and can be erased and programmed electrically. Advantages of flash memories over earlier nonvolatile memories such as EPROM and EEPROM include the ability of electrical erasure and small size.

One well-known drawback of flash memories is the block erase scheme. In a typical flash memory, a whole block of data is erased simultaneously. When a file stored in the block needs to be changed, even if the change involves only a small portion of the block, the whole block must be erased and the whole file is reprogrammed into the block. This block erase and program increases the memory access operations. Consequently, the block erase scheme results in long erasing time, complex operations, wasted power consumption and shorter life time of the memory cells.

Compared with flash memories, the earlier nonvolatile memory EEPROM has smaller erase size. The minimum erased size of EEPROM is one byte rather than one block. This is advantageous because only the bytes that need to be changed are erased and programmed without affecting other bytes. Therefore, EEPROM is extremely attractive for byte-structure systems, such as computer systems. However, one disadvantage of EEPROM is that it uses three transistors to store one bit, thus the chip is large and costly. In contrast, flash memories use only one transistor to store one bit thus the chip size is dramatically reduced. Due to their respective drawbacks, flash memories and EEPROM are currently used in different applications.

Typically, two types of information are stored in a memory system: program information and data information. Known program information such as BIOS controls the operation of a personal computer. This type of information is updated very infrequently, the changes are usually very minor and it requires high memory density. However, data information is frequently updated, the changes are usually major and it does not require high memory density.

Known computer systems and other electronic products generally contain a first type of memory for storing programs and a second type of memory for storing data. In many newer computers, the first type of memory is constructed of flash memory. The flash memory is advantageous because the information stored in the flash memory is nonvolatile and it is high density. The second type of memory is constructed of EEPROM because EEPROM can be electrically erased in small portions but is not high density. As a result, many modern computers include a flash memory chip for storing program information that is rarely updated and has high memory density, and an EEPROM chip for storing data information that is often updated and has low memory density.

While it is a well known desire to consolidate functions, the technologies for manufacturing a flash memory and an EEPROM are different. Therefore, most modern memory systems include a flash memory chip and an EEPROM chip. However, it still remains desirable to integrate memories into the same chip, thus reducing the production cost and the communication time. A known chip that provides a combination feature is called a flash and EEPROM combination memory like Amtel's AT29C432 which provides a 4M bit flash array combined with a 256K bit full featured EEPROM array on a single chip. Although the flash array and EEPROM array are in one chip, they are divided into two independent arrays with predetermined memory sizes. Once the respective memory sizes are defined, they cannot be changed or arbitrarily defined by end users. Furthermore, program information may need as frequent changes as data memory. Moreover, it is preferable to construct both the memories for storing program information and data information with the same technology. In summary, it is most desirable to develop a memory that combines the advantages of both flash memories and EEPROM.

SUMMARY

The invention provides a flash memory with flexible erasing size from multi-byte to multi-block. In particular, the flash memory includes latches to provide the function of a flexible erasing size. A wordline decoder includes wordline latches, a sourceline decoder includes sourceline latches and a bitline decoder includes bitline latches. As a result, a high flexibility of erasing size is available so that single/multiple bytes, single/multiple sub-wordlines, single/multiple wordlines, single/multiple blocks or the whole array can be erased simultaneously.

An exemplary embodiment of a flash memory with a flexible erasing size includes a first bank of flash transistors and a second bank of flash transistors. Each bank of flash transistors forms a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline and the sources of the transistors in the second bank are all coupled to a second sourceline. A wordline decoder is coupled to the wordlines and configured to receive a wordline address signal and to decode the wordline address signal to select a wordline, where the wordline decoder includes a wordline latch configured to latch the selected wordline. A sourceline decoder is coupled to the sourcelines and configured to receive a sourceline address signal and to decode the sourceline address signal to select a sourceline, where the sourceline decoder includes a sourceline latch configured to latch the selected sourceline. A bitline decoder is coupled to the bitlines and configured to receive a bitline address signal and to decode the bitline address signal to latch a selected bitline, where the bitline decoder includes a bitline latch configured to latch the selected bitline.

Goals of the invention are to provide a flash memory that combines the byte and page (one wordline) erase functions of EEPROM and the block (multiple wordlines) erase function of flash memories. The information stored in the flash memory can be electrically erased and programmed. The memory can be used conventionally where one memory array stores program information and another memory array stores data information. The invention can also be used in a novel way where one memory stores both program information and data information. The invention can achieve both byte erasing and the density of one transistor for one bit, thus providing the best solution for fast, easy operations and low cost.

Another embodiment of the invention includes an embedded verification to insure that the erase is performed correctly. In this embodiment, an embedded erase circuit is coupled to the wordline decoder, sourceline decoder and bitline decoder and configured to determine during a scanning operation whether each cell of the selected memory portion has been successfully erased.

The exemplary embodiments can be combined with a voltage pump generator. A voltage pump generator provides operational voltages that are derived from the supplied voltages. For example, if the memory is supplied with 1.5 V, and needs +10 V for a program function, the voltage pump generator creates the required voltage and provides it to the decoder circuits to accomplish the necessary function. Likewise, the voltage pump can provide a negative voltage to the decoder circuits for the erase function.

Advantages of the invention include available flexible erasing size from multi-byte to multi-block and full verifications for erasure, repairing and programming. It is the first invention to provide an adjustable memory size for respective program and data memories on a single chip. The invention eliminates the need for two separate enable signals that are required in known combination memories. Other functions such as embedding erased wordline scanning and searching for the lowest cells threshold are included to enhance the performance of the invention. These advantages and the function are described in detail below.

BRIEF DESCRIPTION OF THE FIGURES

Additional advantages of the invention will become apparent upon reading the following detailed description and upon reference to the figures, in which.

DETAILED DESCRIPTION

Exemplary embodiments are described with reference to specific configurations. Those skilled in the art will appreciate that various changes and modifications can be made while remaining within the scope of the claims. For example, the invention can be used with any type of flash memory using Fowler-Nordheim (F-N) and channel hot electron (CHE) for erase and programming. Note that the traditional decision that an erased state is a low threshold transistor and that a programmed state is a high threshold transistor is arbitrary. In the exemplary embodiments, an erased state is considered to be one where the transistor has a low threshold while a programmed state is considered one where the transistor has a high threshold, however, the invention can also be practiced with alternate states. All electrical parameters are given by example and can be modified with good results. For example, in the exemplary embodiments, a supply voltage (VDD) is considered as 5 V, but could alternatively be 3 V, 1.5 V or other supply voltage. If a different supply voltage is chosen, the various operational voltage levels would be modified to reflect the different supply voltage.

FLASH MEMORY ARCHITECTURE

Figure 1:
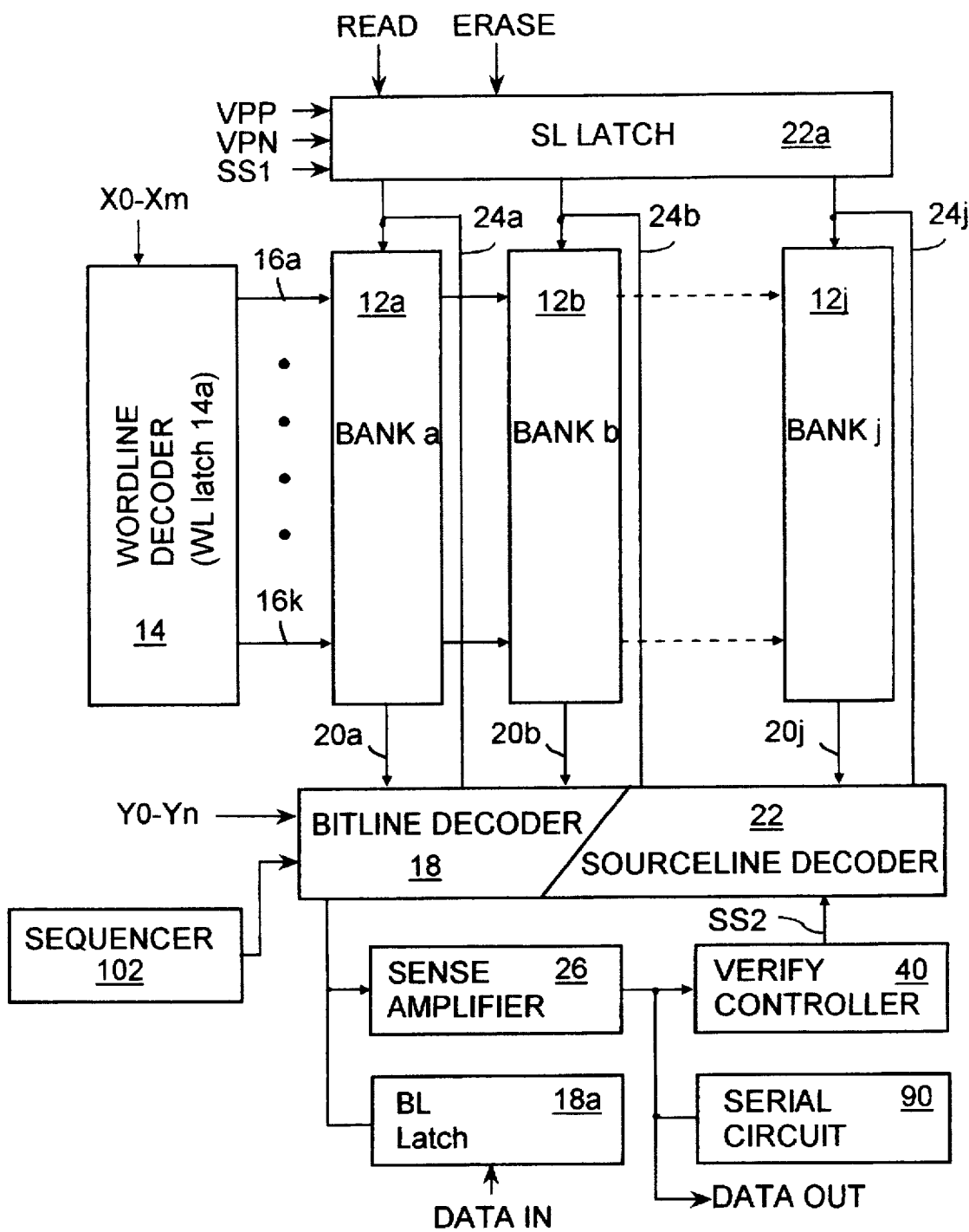
FIG. 1 depicts a multi-bank flash memory incorporating an embodiment of the invention.

FIG. 1 depicts a flash memory 10 incorporating an embodiment of the invention. Flash memory 10 includes a plurality of banks 12a–j that store information. Each bank is constructed similar to a traditional flash transistor array, with rows and columns of flash transistors in a NOR-plane configuration.

Alternately, other transistor configurations can be used such as a NAND-plane.

A wordline decoder 14 is coupled to each of the banks 12a–j. Wordline decoder 14 receives an address input X0-Xm and decodes the X0-Xm input to activate a wordline 16a–k. Ordinarily, wordlines 16a–k represent a plurality of wordlines (WL0-WLk) where k represents 2 raised to the power m. That is, a design using 4 address lines X0-X3 will provide 16 wordlines WL0-WL15. When wordline decoder 14 is addressed by X0-Xm, a corresponding wordline WL0-WLk is activated.

A bitline decoder 18 is coupled to each of the banks 12a–j. Bitline decoder 18 receives an address input Y0-Yn and decodes the Y0-Yn input to couple selected bitlines 20a–j from a selected bank to sense amplifier 26. Ordinarily, the bitline (e.g., 20a) includes a plurality of bitlines (BL0-BLq) where q represents a stored word that is usually 8 bits, 16 bits, 32 bits or other number of bits that represents a word to a processor.

A sourceline decoder 22 is also coupled to each of the banks 12a–j. Sourceline decoder is also controlled by the address input Y0-Yn to selectively apply predetermined voltages to sourcelines 24a–j. The bitline decoder 18 and sourceline decoder 22 operate in unison to activate the selected bitlines and sourcelines respectively based on the address input Y0-Yn.

Both wordline decoder 14, bitline decoder 18 and sourceline decoder 22 are provided with the operational voltages VPN, VSS, VDD, VPP, VPI and others if necessary. To read, program and erase the memory, the voltages are applied to the selected flash memory cells as described below.

LATCH OPERATION FOR SINGLE-BYTE TO MULTI-BLOCK ERASE

In a conventional flash memory array, a common sourceline supplies the array with a sourceline signal. Therefore, each byte cannot be independently erased due to the limitation that the sources of each byte are all applied with the same erasing voltage. However, the invention employs latches in the sourceline decoder, the wordline decoder and the bitline decoder that provide the function of a flexible erasing size.

A. Sourceline Latch

Figure 2:
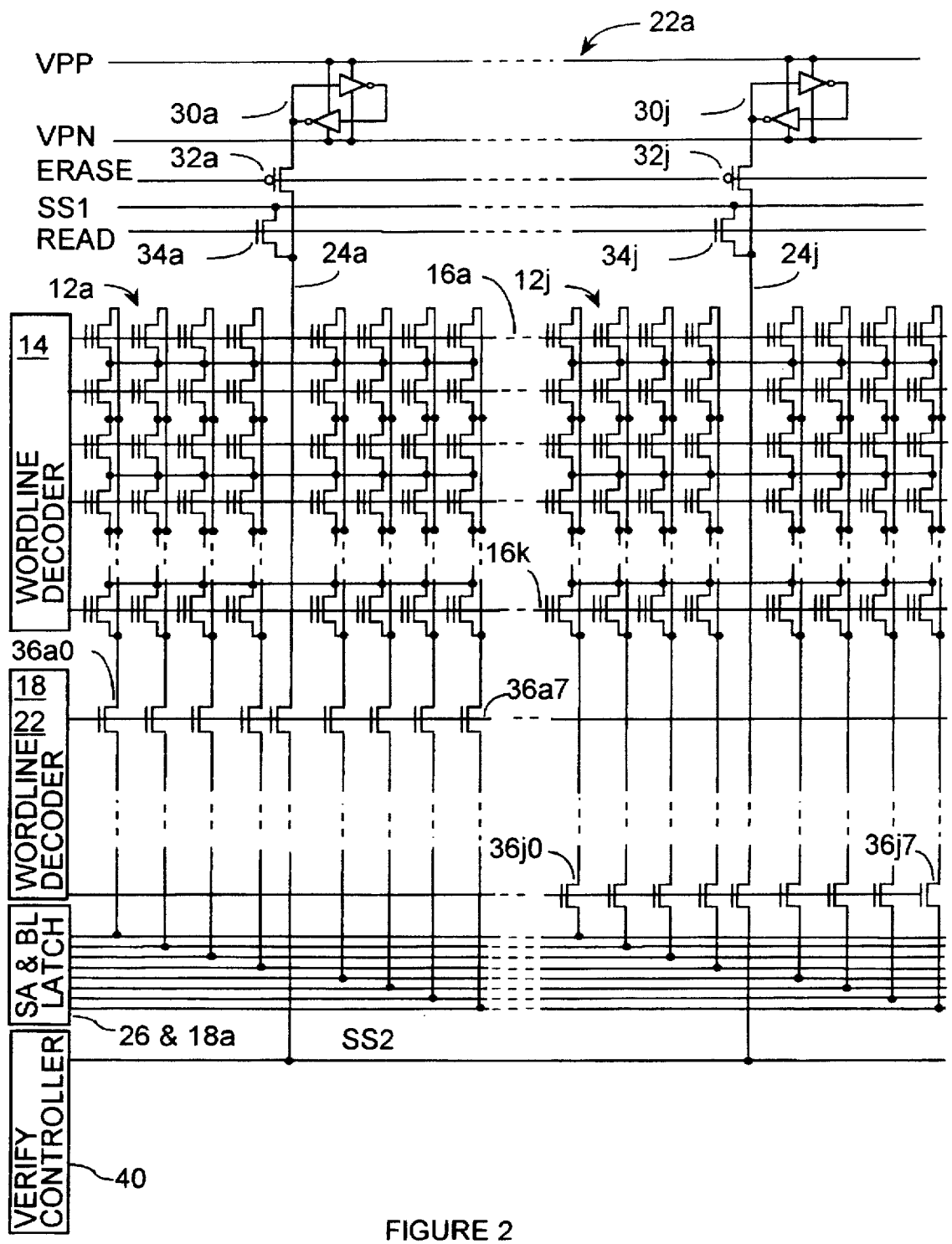
FIG. 2 depicts a multi-bank flash memory incorporating an embodiment of the invention.

FIG. 2 depicts an implementation of the invention where each array $12a-j$ is eight transistors wide (one byte). The sourcelines $24a-j$ are coupled to the center area of the arrays $12a-j$ to provide operational voltages evenly to all the transistors in the array. The sourcelines $24a-j$ are separated from one another and are coupled to sourceline latch $22a$. SL latch $22a$ provides each sourceline $24a-j$ with an individual latch $30a-j$. When the bitline decoder 18 selects a byte, the latches $30a-j$ are also selected and coupled to signal SS2, which will set or reset the latches $30a-j$ to a value that determines whether the byte needs to be erased. After the latches $30a-j$ are set, the latches $30a-j$ then provide and maintain an erase voltage or an inhibit voltage to the sourcelines $24a-j$ of each byte to either allow or prevent the erase from being performed on that array $12a-j$ according to the latch value. If multiple latches $30a-j$ are set to an erase value, multiple bytes are erased simultaneously. This approach is universal and can be used in a first erase technique where an erased state is a low threshold transistor or in a second technique where an erased state is a high threshold transistor. For clarity, the value that determines the erasing/inhibiting state is represented as an ERS/INH value, respectively. In the first technique, the ERS value is high (e.g. +5 V) and the INH value is low (e.g. ground), and in the second technique, the ERS value is low and the INH value is high.

To multiply select the bytes, all the latches $30a-j$ are initialized to the INH value, and then the latches $30a-j$ of selected bytes are reset to the ERS value. To initialize all the latches $30a-j$, transistors $32a-j$ and $34a-j$ are on and on respectively, and signal SS1 is set to the INH value. After the latches $30a-j$ are initialized, transistors $32a-j$ and $34a-j$ are on and off respectively, and signal SS2 is set to the ERS value. Then, the addresses of the selected bytes are sequentially provided to turn on the bitline pass gate transistors $36a0-a7$ to $36j0-j7$ of the selected bytes and to reset the multiple latches $30a-j$ to the ERS value. If only one byte is selected, the erasure is a single-byte erasure. If multiple bytes are selected, the erasure is a multiple-byte erasure.

After the selected latches $30a-j$ are reset, the latches $30a-j$ which store an ERS value provide an erasing voltage from VPP (or VPN, depending on whether the erased state is a high or low threshold transistor) to the sourcelines; otherwise, the latches $30a-j$ provide an inhibiting voltage from VPN (or VPP) to the sourcelines. While the multi-bytes are selected by the latches $30a-j$, the wordline is selected by wordline decoder 14. The selected wordline then provides an erasing voltage while the unselected wordlines provide an inhibiting voltage. As a result, the same multi-selected bytes of arbitrarily selected wordlines are erased simultaneously.

B. Wordline Latch

Wordline decoder 14 includes a wordline latch $14a$ that includes plurality of wordline latches for latching wordlines $16a-k$. These latches are set by address inputs X1-Xm when an erase is requested. The latches are similar to those explained with reference to SL latch $22a$ including latches $30a-j$. A detailed description of wordline latches is provided in U.S. patent application Ser. No. 08/664,639 and assigned to Aplus Integrated Circuits. The wordline latches provide a useful function of latching multiple wordlines to erase multiple bytes simultaneously. Moreover, the wordline latches provide a mechanism for overcoming the overerase issue discussed below. A description of wordline latches that overcome the overerase issue is provided in U.S. patent application Ser. No. 08/676,066 and assigned to Aplus Integrated Circuits.

Note that although the wordline decoder of the invention includes WL latches to achieve multi-wordline, multi-block erasing, a conventional row-decoder can still be used. Also note that when multi-bytes are erased, generally one sub-wordline or one wordline is selected. If multi-wordlines are selected, the same bytes of each wordline will be erased.

C. Bitline Latch

Bitline decoder 18 has a bitline latch $18a$ that includes a plurality of bitline latches for latching bitlines $20a-j$. Normally, bitline $20a$ represents a plurality of bitlines such as eight, that represent a word to a processor. The bitline latch $18a$ within bitline decoder 18 provides the ability of the flash memory to set or reset the bitlines to enable or inhibit an erase for each bitline simultaneously. FIGS. 1 and 2 show bitline latch $18a$ in a separate box closely coupled with the sense amplifier 26. For practical purposes, this is the most likely configuration for the latch $18a$. The reason is that during normal read operations, the latch is not used and the bitlines are passed directly to the sense amplifier 26 to generate the data out. The bitline latch $18a$ is used in erase and program procedures and thus is depicted in a separate box for the purpose of showing that the latch function is performed physically outside the bitline decoder operation. All the benefits described previously with regard to the sourceline latches and the wordline latches are equally applicable to the bitlines latches.

ERASING

Figure 3:
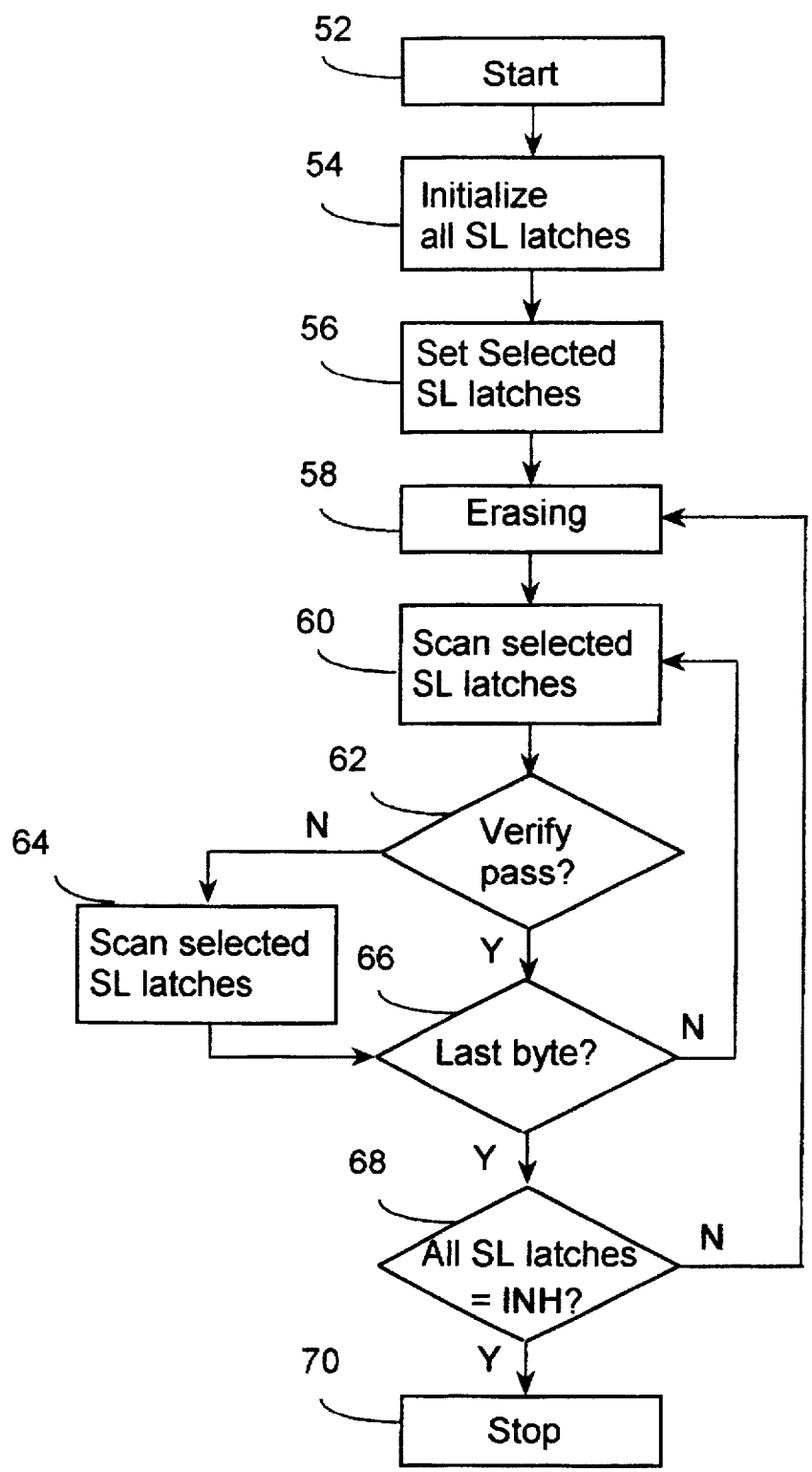
FIG. 3 is a flowchart showing operation of the flash memory of FIG. 1.

The erasing procedure is described with reference to the FIG. 3 flowchart. In step 52, an erasing procedure is requested. At step 54, the SL latch is initialized and all SL latches are set to the INH value. At step 56, sourceline decoder 22 determines which sourcelines to activate in order to set the appropriate sourceline latches $30a-j$. At step 58, the sourceline decoder, wordline decoder and bitline decoder provide respective erasing voltage pulses on the selected lines to erase the selected cells. At step 60, the selected SL latches are scanned to determine which banks $12a-j$ have to be checked for erasing conditions. At step 62, after each erase pulse, the selected bytes are read to verify the erasing condition. If the byte is erased, the verification is true and the latch $30a-j$ is released. If not, step 64 is performed to set the respective latch to continue erasing. Step 66 continues the scan from step 60 and if there are sourcelines that still need to be checked, the procedure is passed back up to step 60 to continue the scanning. Otherwise, step 68 checks whether all the SL latches are set to the INH value. If not, the processing is passed back up to step 68 to continue erasing. If so, the procedure is passed to step 70 to end the erasing based on a successful erasure.

EMBEDDED VERIFICATION

The embedded verification feature is explained with reference to FIG. 2. The simplest way to perform a verification is to check the multi-selected bytes one at a time. The invention includes two embodiments to achieve the verification. In the first embodiment, each selected byte is located serially and the verification is performed upon the located byte. To find the selected bytes, transistors 32a–j and 34a–j are on and off respectively, and the bitline pass gate transistors 36a0-a7 to 36j0-j7 are sequentially turned on to check the data stored in each SL latch 30a–j from SS2. If the SL latch is set to the ERS value, a read operation is performed to verify the byte. After that, the next SL latch is checked until all the bytes of the array are checked. If the latch is set to the INH value, the verification of the byte is skipped and the next SL latch is checked until all the bytes of the array are checked. This procedure is called a scanning of the selected bytes. Note that, since the selected latches provide the erasing voltage from VPP to the sourcelines for erasing, in scanning, VPP is lowered to the VDD level; otherwise, the ERS and INH values may overwhelm the sense amplifier.

Figure 4A:
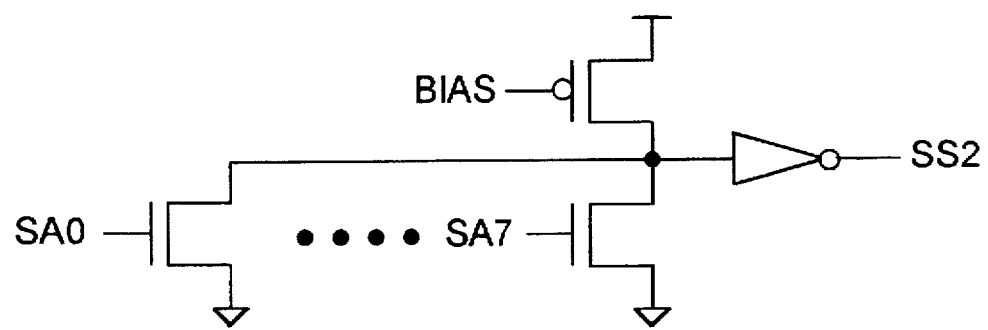
FIGS. 4A-B depict multi-level drivers according to an embodiment of the invention.
Figure 4B:
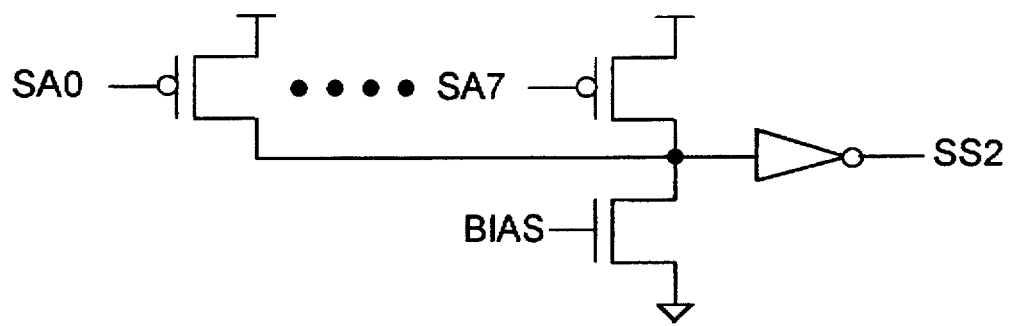

To read one byte, transistors 32a–j and 34a–j are off and on respectively to isolate all the SL latches and to couple all the sourcelines 24a–j to ground (SS1). Then, wordline decoder 14 applies the read voltage to a selected wordline 16a–k and a regular read operation is performed. FIG. 4A depicts the verification circuit for the erasing technique where an erased state is a low threshold transistor and where SA0–SA7 are one byte of data from sense amplifier 26. FIG. 4B depicts the verification circuit for the erasing technique where an erasing state is a high threshold transistor and where SA0–SA7 are one byte of data from sense amplifier 26. The circuits perform a NOR Boolean function. If the selected byte passes the erasing verification, the verify controller 40 generates an INH value to reset the SL latch; otherwise, the circuit generates an ERS value to reset the SL latch.

Figure 5:
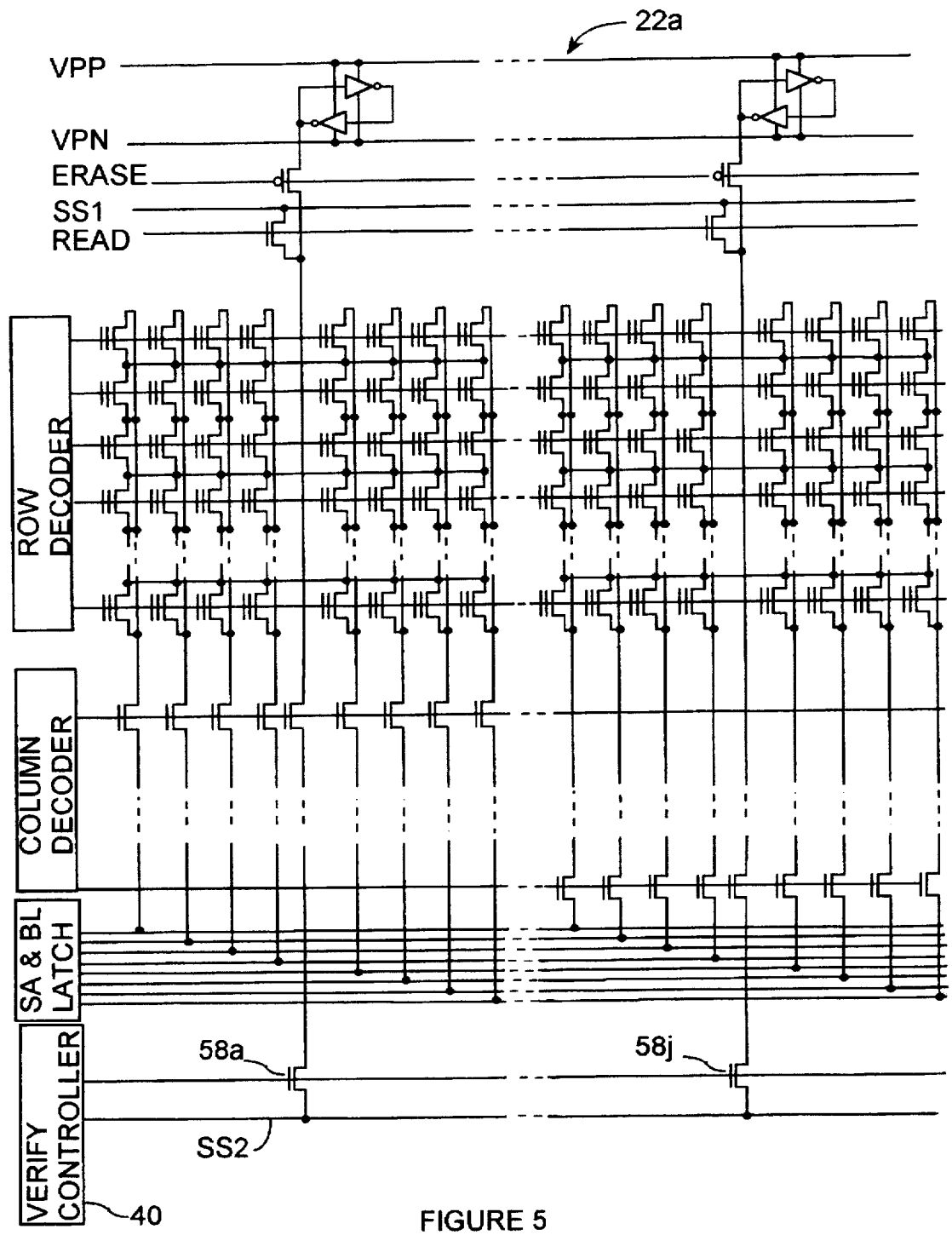
FIG. 5 depicts a multi-bank flash memory incorporating an embodiment of the invention.

In the second embodiment, all the bytes are verified sequentially regardless of which bytes are selected for erasing or unselected for erasing. Because the bytes unselected for erasing are also verified, the verification will fail for those bytes and the bytes will be reset to an ERS data if the previous circuit is used. To avoid this problem, the previous circuit is modified as shown in FIG. 5. When the byte is erased successfully, the verify controller 40 generates a high signal to turn on transistors 58a–j and to reset the SL latch 30a–j to the ERS value by signal SS2; otherwise, the latch remains set with the original value. Therefore, the original unselected bytes will remain in the INH value even if the verification fails for that byte. This circuit eliminates the requirement of the scanning procedure. However, the verification time is slightly increased because reading all the bytes of data is more time consuming than scanning one sourceline latch.

Figure 6:
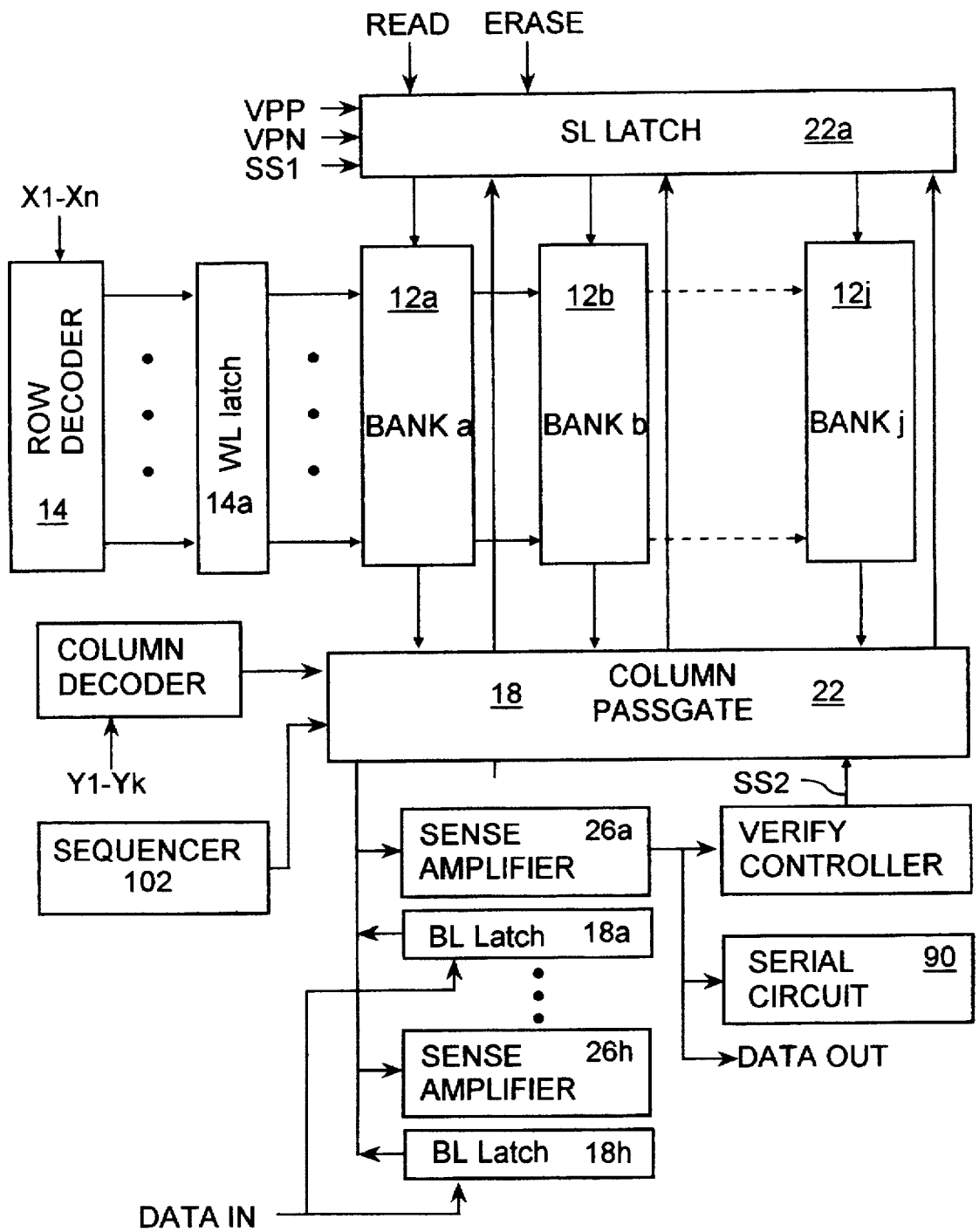
FIGS. 6 depicts a multi-bank flash memory incorporating an embodiment of the invention.

A parallel verification embodiment is depicted in FIG. 6. In contrast to the conventional byte-read structure described above, this embodiment utilizes a page-read structure. By employing a greater number of sense amplifiers 26a–h, more bytes can be programmed, read, and verified in parallel. The plurality of bytes which can be parallel read is called a page. FIG. 6 depicts an exemplary eight bytes of sense amplifiers 26a–h and BL latches 28a–h.

Figure 7A:
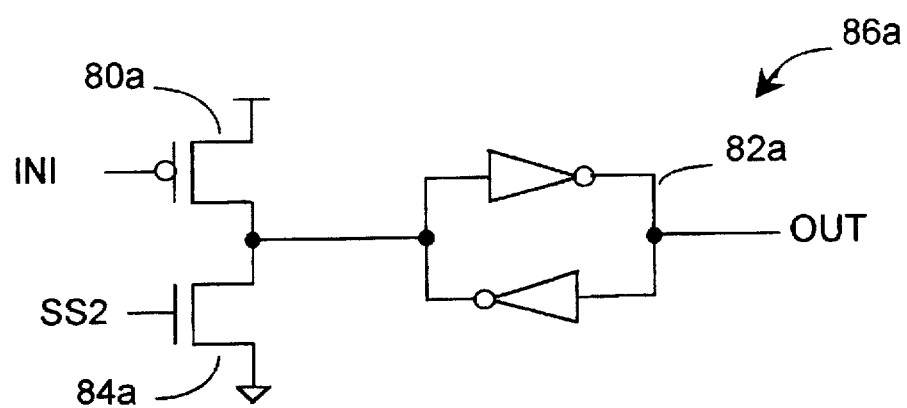
FIGS. 7A-B depict multi-level latches according to an embodiment of the invention.
Figure 7B:
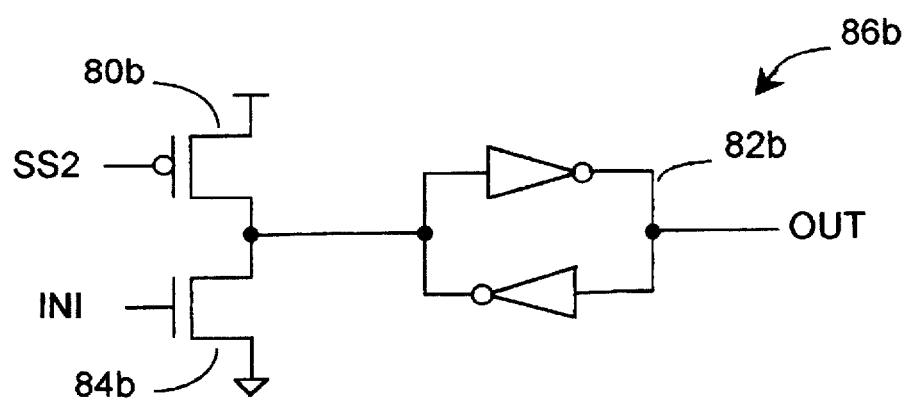

After all the selected bytes are verified and the SL latches 30a–j are updated, all the SL latches 30a–j are collectively checked. If all the SL latches are set to the INH value, the erasing procedure is complete, and a following procedure of repairing is performed. For an explanation of the repairing procedure, refer to U.S. patent application Ser. No. 08/676, 066 and assigned to Aplus Integrated Circuits, Inc. If any latch 30a–j still remains at the ERS value, the next erasing pulse is provided to erase the byte or bytes again. The SL latches can be checked in parallel or serially. The parallel circuit is similar to the circuit depicted in FIGS. 4A and 4B, except the inputs are coupled from the SL latches rather than the sense amplifiers. FIG. 7A and 7B depict the serial circuit for the erasing technique where the erased value is a low threshold transistor and the programmed state is a high threshold transistor. Before the verification, transistors 80a and 80b are turned on to preset latches 82a and 82b. Then, each byte is verified serially and determines if the latch needs to be reset. Signal SS2 is coupled to transistors 84a and 84b. If any byte fails the verification, signal SS2 will turn on transistors 84a and 84b and reset the latch to indicate the erasure not complete; otherwise, the latch remains in preset state to indicate the erasure is complete. FIG. 1 shows the location of the serial circuit 90.

The verification procedure described above is performed completely embedded. An advantage of the embedded verification is that the data needs not be externally read for verification, thus reducing the burden of an external CPU. Another advantage is that the addresses of the selected bytes need not be memorized or reloaded, thus reducing the requirements of increased address buffers and operation complexity.

DECODER CONFIGURATION

Figure 8:
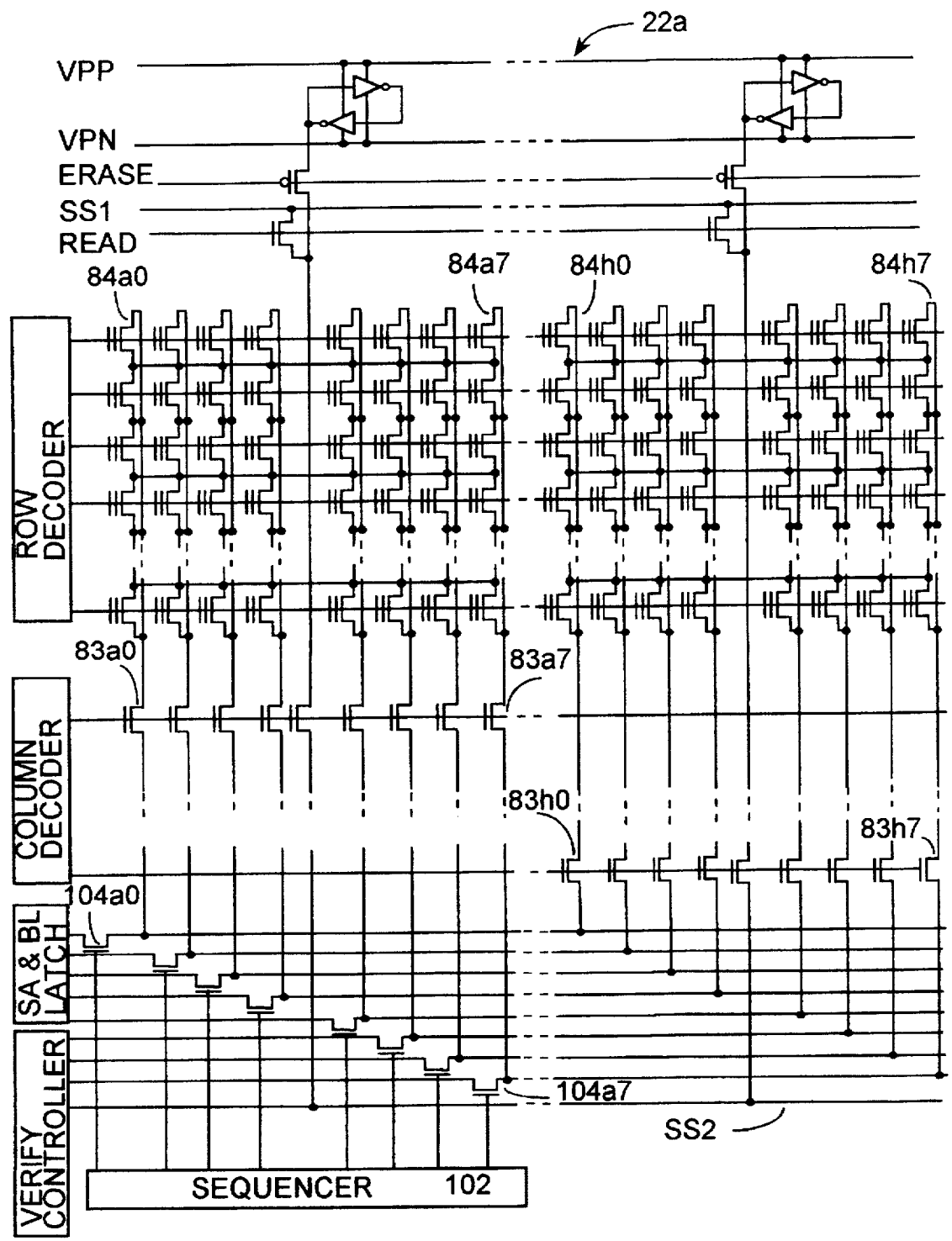
FIG. 8 depicts a multi-bank flash memory incorporating an embodiment of the invention.

Since the invention can be used as replacement for an EEPROM. The invention should provide the same decoding scheme and I/O scheme as a conventional EEPROM. Conventional EEPROMs are generally available in two configurations: parallel and serial. FIG. 2 depicts a parallel configuration where one byte of data is input/output parallel. FIG. 8 depicts a serial configuration where only one bit data is input/output at a time. In the serial configuration, a sequencer 102 is coupled to a plurality of transistors 104a0–a7. Sequencer 102 is configured to couple the bitlines 20a to sense amplifier 26 one at a time by activating transistors 104a0–a7 one at a time.

Figure 9:
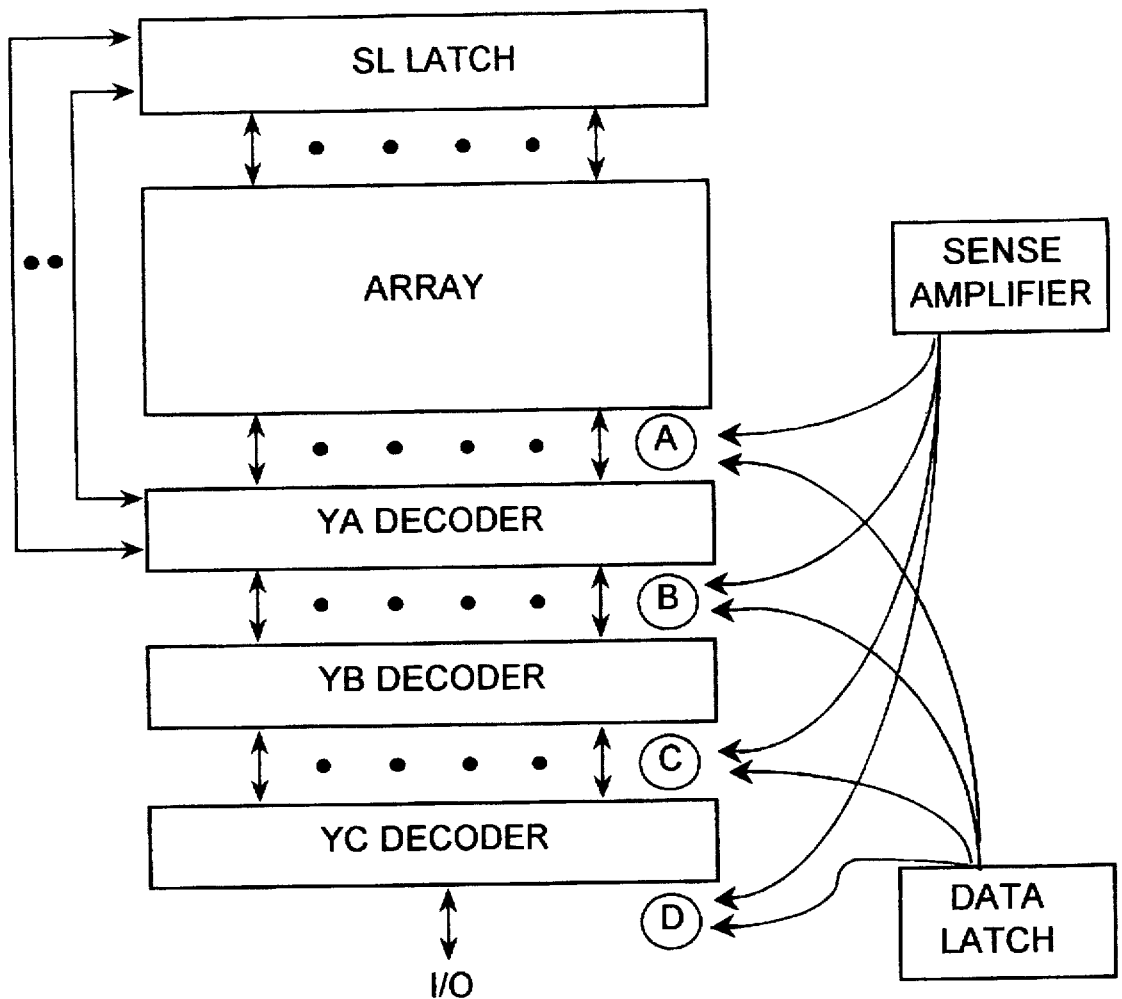
FIG. 9 depicts a flash memory incorporating a multi-bitline decoder incorporating an embodiment of the invention.

For either configuration, the sense amplifiers 26 and the bitline latches 18a can be constructed any position demonstrated in FIG. 9 by locations A, B, C and D. The number of sense amplifiers and bitline latches are determined by the location of the sense amplifier 26 and bitline latch 18a in the decoder layout. Location A has the largest number and the location D has the smallest number. The number of the sense amplifiers determines the number of bit lines which can be read simultaneously. The number of the bitline latches determines the number of bit lines that can be erased and programmed simultaneously. When both the sense amplifiers and bitline latches are located in position A, each bitline has an individual sense amplifier and a bitline latch. Thus, all the bitlines can be erased, programmed, read and verified simultaneously. This is generally referred as "page erase," "page programming" and "page read." When both the sense amplifiers and bitline latches are located in position D, one byte of bitlines can be erased, programmed, read and verified simultaneously. This is refereed as "byte programming" and "byte read". In FIG. 8, in the same situation, only one bitline can be erased, programmed, read and verified at one time. This is referred as a "serial erase," "serial program," "serial read" and "serial verify" respectively. Obviously, serial operations are very time consuming and not practical. Generally, at least eight sense amplifiers are used to achieve byte operations. However, the invention anticipates any configuration of the sense amplifiers and bitline latches covered by the claims.

Figure 10A:
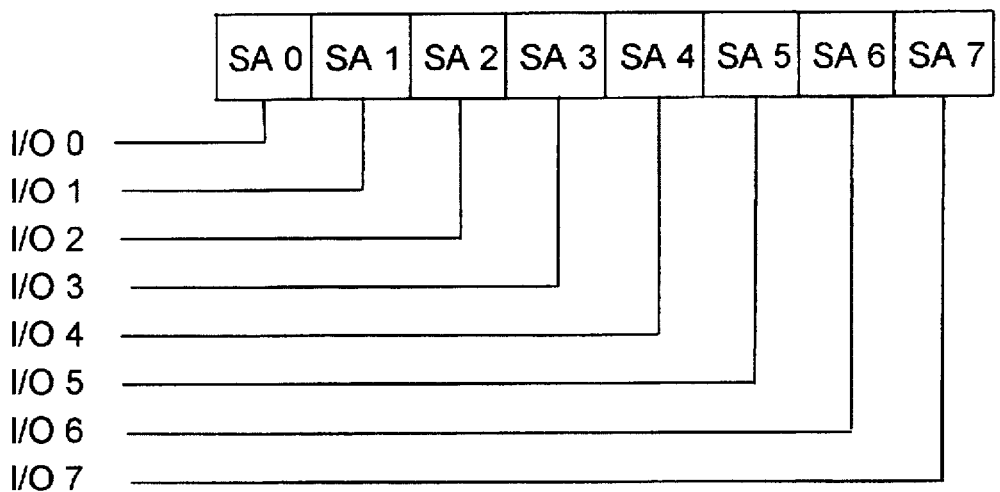
FIGS. 10A-B depict multi-sense amplifiers according to embodiments of the invention.
Figure 10B:
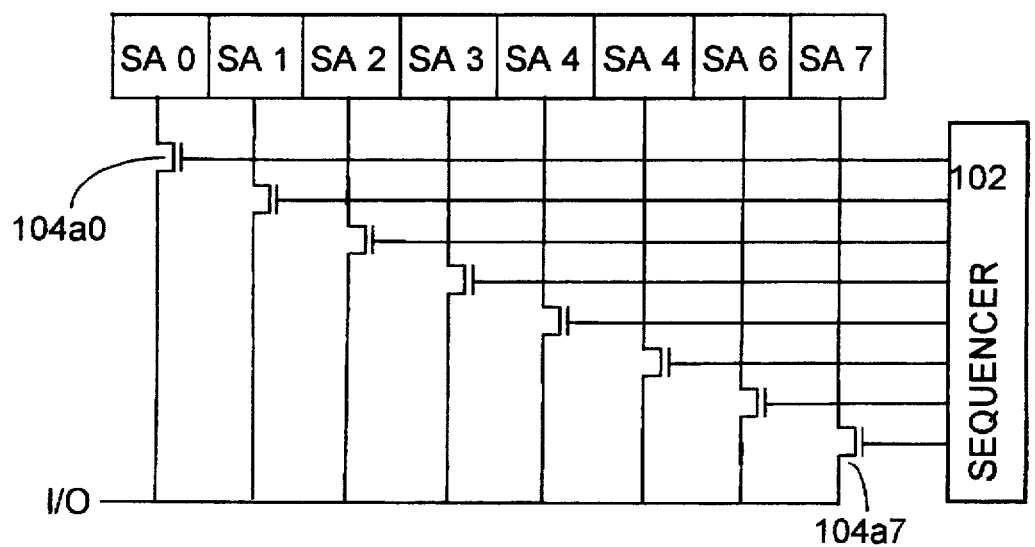

FIG. 10A and 10B show a comparison of parallel I/O and serial I/O, where eight sense amplifiers SA0–SA7 are shown as exemplary. In the parallel configuration of FIG. 10A, eight bitlines are input/output simultaneously. In the serial configuration of FIG 10B, the bitlines are controlled by sequencer 102 to input/output one bitline at a time.

PROGRAMMING

The invention can further employ a variety of programming methods. Four programming techniques are used in the flash memory. The first technique is byte-programming by channel hot electron injection (abbreviated to CHE). The second technique is a page-programming by CHE. The third technique is a page-programming by low current CHE. The fourth technique is a page-programming by Fowler-Nordheim tunneling (abbreviated to FN).

In CHE, there generally exists a concern having to do with high current. During the programming, the cells conduct high current. If the high voltage generator, or voltage pump, fails to supply the necessary current, the high voltage will drop and the programming efficiency will decrease. Another problem is that the source voltage may increase due to the large current flowing to the sourceline's resistance. This also reduces the programming efficiency. Therefore, with CHE programming, it is preferable to prevent a large number of cells from being programmed simultaneously with a single low VDD power supply.

Figure 11A:
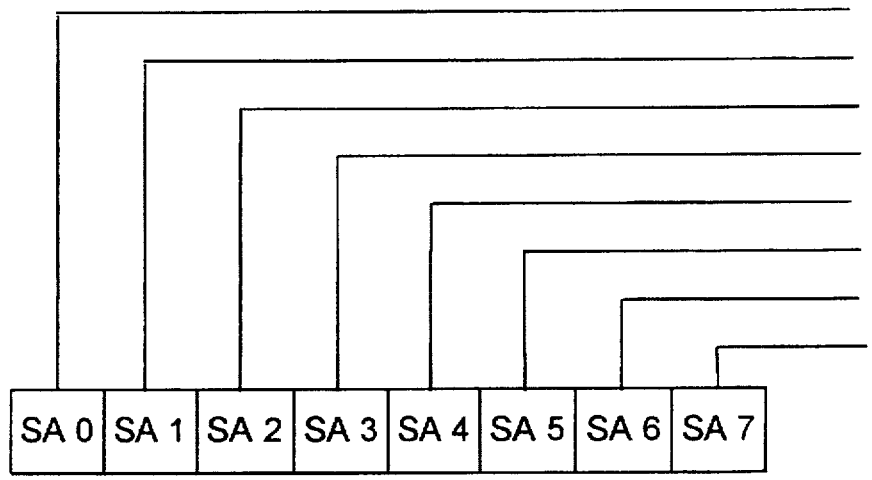
FIGS. 11A-B depict multi-sense amplifiers according to embodiments of the invention.
Figure 11B:
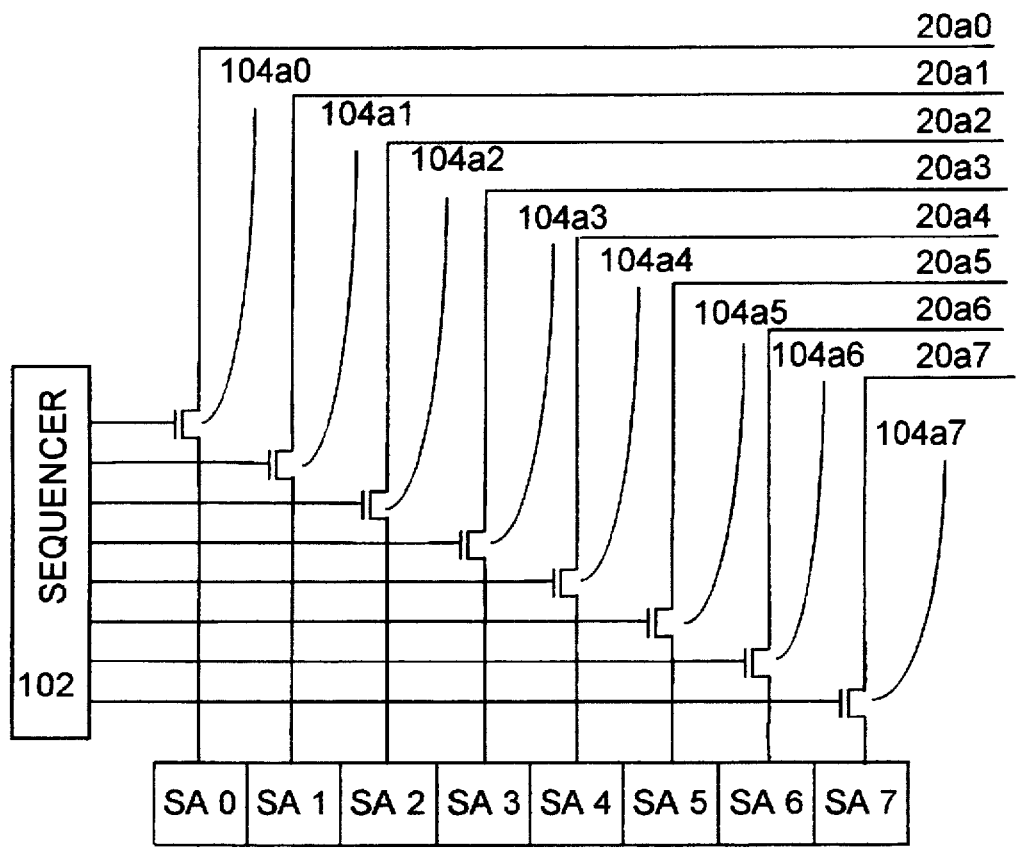

In FIGS. 11A and 11B, an embodiment is provided to limit the number of bitlines for programming. FIG. 11A shows an exemplary byte programming configuration. FIG. 11B shows the limited number of bitlines programming configuration. In FIG. 11B, sequencer 102 controls a limited number of pass gates 104a0–a7 to be turned on one at a time, thus to allow the limited number of bitlines be programmed. The number can be modified depending on the current supply capability of the high voltage generator and the sinking ability of the sourcelines. Because the sourceline 24a–j is positioned in the center of each byte, as shown in FIG. 2, the current supply limitation must be met in order for both sides of the byte to be programmed together. For example, assuming the high voltage generator can allow two bitlines be programmed at the same time, pass gates 104a0 and 104a2 are turned on to program bitlines 20a0 and 20a2 first, and then pass gates 104a1 and 104a3 are turned on to program bitlines 20a1 and 20a3 second, and so on. The unselected pass gates are shut off, thus the bitlines are floating to inhibit programming. The sequencer 102 is capable of activating pass gates 104a0–a7 in any order and can activate multiple pass gates simultaneously. Other sequencers that can turn on other number of pass gates can be constructed by modifying the same concept.

Figure 12:
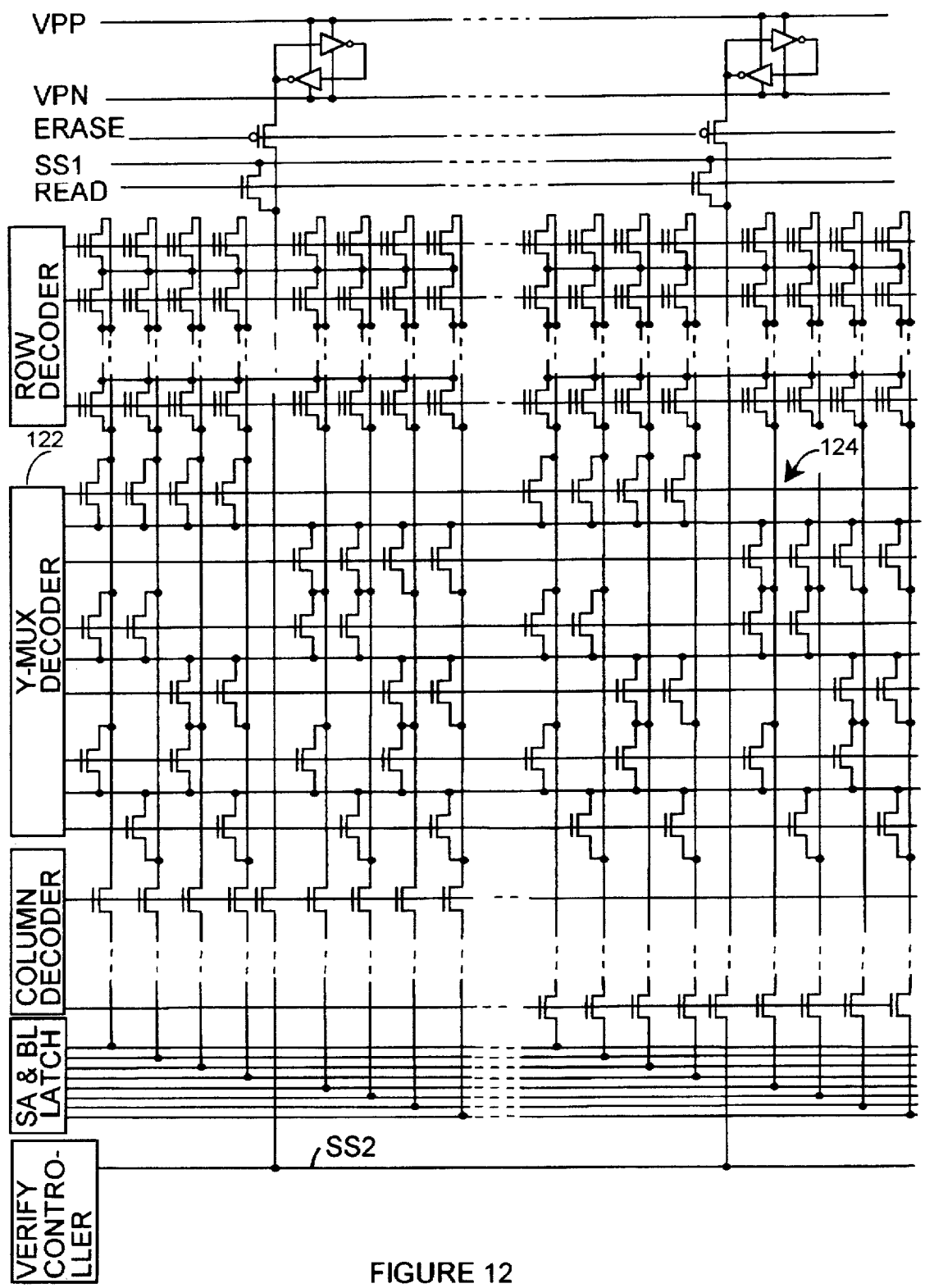
FIG. 12 depicts a multi-bank flash memory incorporating an embodiment of the invention.

As mentioned in the last paragraph, the unselected bitlines are grounded in programming. Because the unselected bitline is not provided with the high voltage for the programming condition, the programming is inhibited. FIG. 12 shows another embodiment where an additional decoder 122 and additional control circuitry 124 is added to the circuit of FIG. 2. When a bitline is not selected, the decoder 122 provides an inhibiting voltage to the unselected bitlines, thus increasing the inhibiting effect. The additional decoder 122 and control circuitry 124 can also be incorporated into the embodiments shown in FIGS. 5 and 8.

A similar procedure can be performed for page-programming. In this case, a plurality of high voltage generators are used to provide enough current for the page-programming procedure. Each high voltage generator is associated with a byte or group of bytes and provides the program voltage for that group. This limits the programming bitlines and allows enough current to be generated to efficiently program the selected page simultaneously. To clarify the technique for high current CHE programming, it is preferred not to program all 8 bits in the same byte simultaneously. However, it is still reasonable to program portions of different of bytes simultaneously as long as the high voltage bitline for each byte is generated from a separate voltage pump that can sustain the current to the selected byte.

For a low current CHE or FN programming, there is no high conduct current problem. Thus, a page of bitlines can be programmed parallel. However, the conventional CHE is still more popular because of the simple technology and high yield.

READING

The invention can be used for both serial reading and parallel reading. Referring to FIG. 2 for a byte-reading configuration, where sense amplifier 26 has eight sense amplifiers therein, one byte data can be read out simultaneously. Referring to FIG. 6 for a page-reading configuration, where a plurality of eight sense amplifiers 26a–h are used, multiple bytes (e.g., a page) of data can be read in parallel. FIG. 6 provides that eight bytes can be read simultaneously although more or less sense amplifiers can be configured in the flash memory to provide more or less bytes of input/output data as needed.

The sense amplifiers 26a–h and BL latches 18a–h are also used to control the programming and erase verification. Therefore, multiple bytes can also be programmed simultaneously. In this configuration, the programming time and the verification time are reduced.

Both the byte configuration and the page configuration can be modified for serial reading. Since each sense amplifier 26a–h is associated with a BL latch 18a–h, for serial reading, the data parallel read from the sense amplifier can be stored in the BL latch 18a–h, and then serially output from the BL latch 18a–h. A bitline decoder will then select the data for output.

Figure 13:
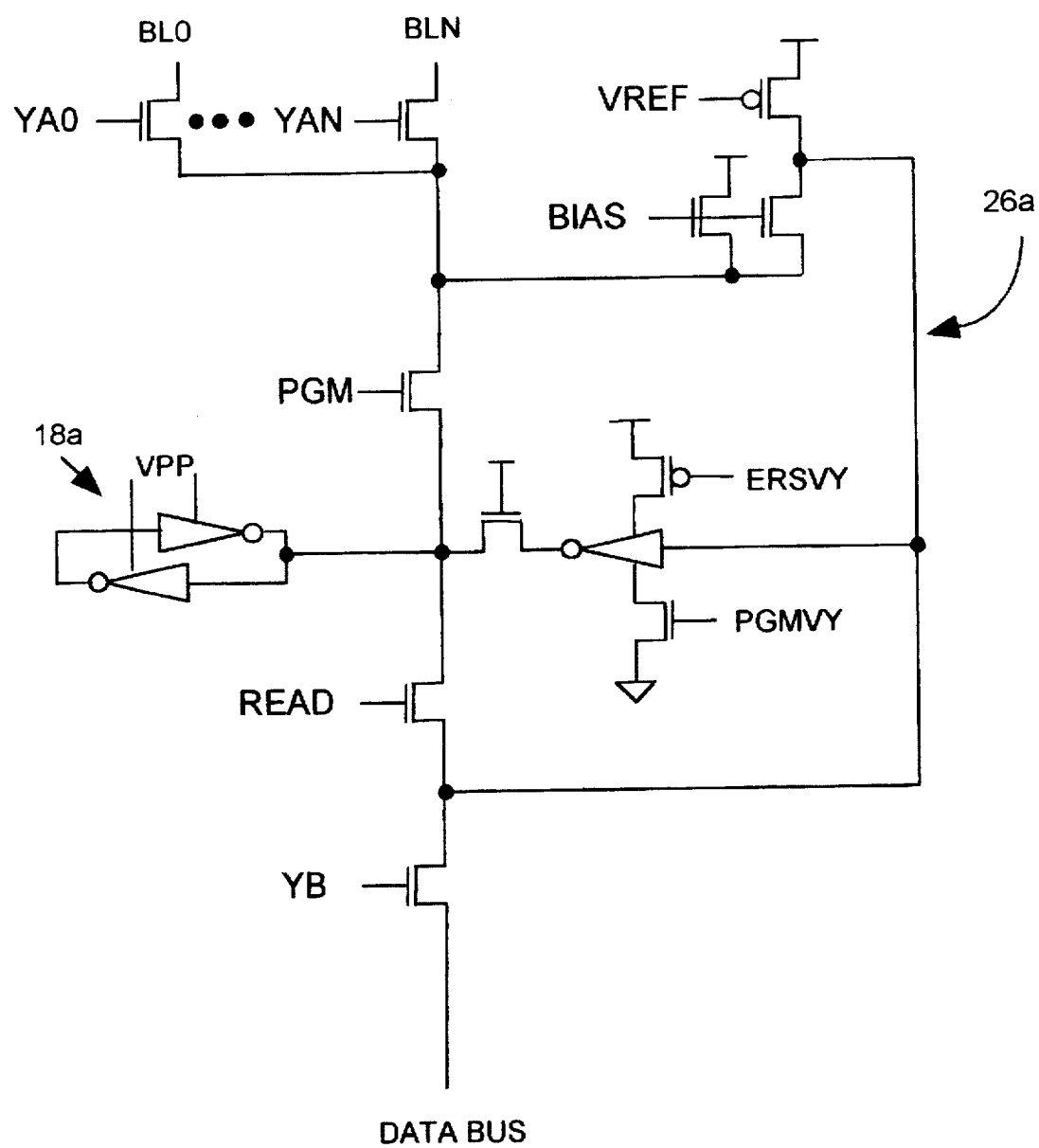
FIG. 13 depicts a multi-level latch according to an embodiment of the invention.

The read technique for the invention is similar to a conventional memory where a general purpose sense amplifier can be used. FIG. 13 shows a preferred embodiment of a sense amplifier 26a and a bitline latch 18a, which is also used to internally control the programming procedure and verification.

Figure 14:
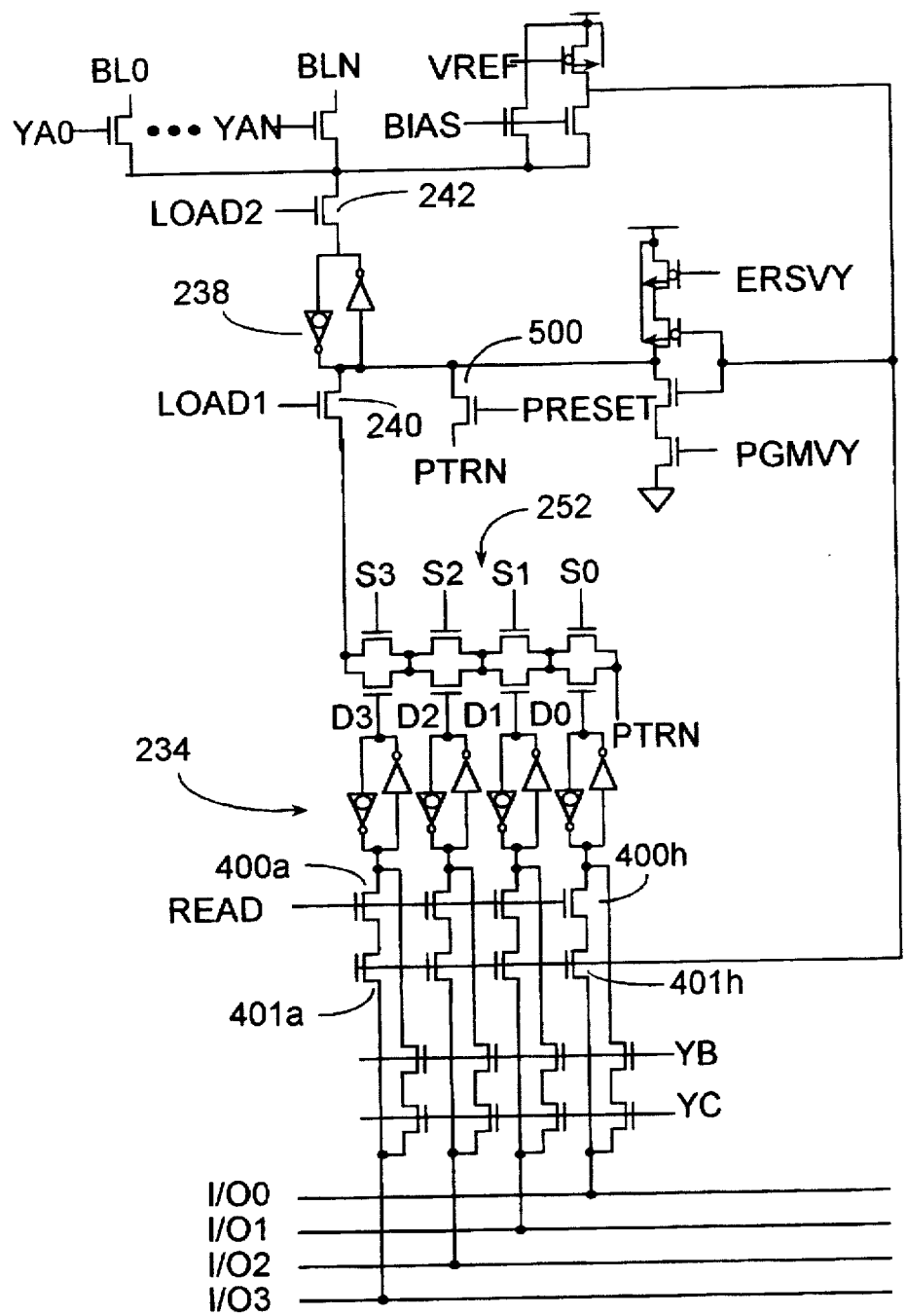
FIG. 14 depicts a data latch according to an embodiment of the invention.

For multi-level cells, the read technique is quite unique. FIG. 14 depicts a sense amplifier and bitline latch for a multi-level memory. A detailed explanations for the sense amplifier and the data latch are provided in U.S. patent application Ser. No. 08/664,639 Assigned to Aplus Integrated Circuits, Inc. The circuit can also embedded control the programming procedure and verification.

OVERERASE ISSUE

When the invention is used in applications where an erased state is a low threshold cell, an over-erase issue should be concerned. A technique for solving the overerase issue is presented in U.S. patent application Ser. No. 08/676,066 Assigned to Aplus Integrated Circuits, Inc. When a multi-byte erasure is performed, because all the bytes are located in the same wordline, the overerase issue is prevented automatically when repairing the overerased cells. When a multi-block or chip erasure is performed, the wordline decoder with wordline latches introduced by the referenced related patent applications can be used to prevent the overerase issue from happening when repairing. Known techniques cannot prevent the overerase issue when repairing the cells, thus the yield is low. However, by incorporating the invention into those known circuit configurations, the yield is increased.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3 V), and needs VPP(+10 V) for a program function, the voltage pump generator creates the needed voltage and provides it to the decoder circuits to accomplish the necessary function. Likewise, the voltage pump can provide a negative voltage VPN(−10 V) to the decoder circuits for the erase function.

CONCLUSION

The invention provides many advantages over known techniques. The invention can be used in place of many currently employed memories such as conventional flash memories, EEPROM memories and combined flash and EEPROM memories. For instance, when the invention is used in place of combined memories, only one enable signal is needed and the memory can be arbitrarily configured to by the user. This provides a great advantage over the known memories because the invention provides more erase and program flexibility than known memories. The invention also includes the optimal overerase repairing, and the ability to verify the status of the memory. The invention reduces program time. In a typical flash memory, the entire array is erased and re-programmed, which is a time-consuming procedure. Even when a page-erase feature is provided, the entire page is erased and re-programmed, which is also time-consuming. The invention provides a fast and convenient way to erase only those bytes that need to be reprogrammed. The invention reduces time and provides improves processor access to the flash memory. Additionally, the invention reduces power consumption by using power only when a byte-erase and re-program are required. This is an important advantage for portable electronics.

The invention provides a universal technique for allowing a flexible erase from multi-bytes to multi-blocks, and thus, the invention can be used in any type of memory array, such as NOR plans (including conventional NOR, dual-string NOR and divided bitline NOR), NAND plans and AND plans, and so on.

The invention can be also used in any type of nonvolatile memory cells, such as stacked-gate cells, split-gate cells, multi-level cells and P-channel cells. The invention can be practiced where either an erased state is a low threshold cell or a high threshold cell. The invention can be used in any array structure, any block arrangements, and any row and column decoding schemes. These applications are anticipated and remain within the scope of the invention.

The invention introduces a novel embedded verification and sourceline latch scanning procedure to reduce the burden of the CPU and erasing time. However, a conventional approach used in EEPROM that uses an external verify procedure, or a conventional approach used in EEPROM that the erasing time is prolong to achieve a deep erasure and the verification is skipped can be also used with the invention.

The invention also improves the longevity of the flash memory. Since only the bytes that require re-programming are erased, stress on the flash memory cells is reduced. As a result, the invention can provide a large number of operable program/erase cycles, such as $10^6$ program/erase cycles, in a flash memory. Finally, flash memories incorporating the invention can be constructed using any size array such as a 16×32, 1K×1K, 1K×2K, or N×M array.

Having disclosed exemplary embodiments and the best mode, modifications and variations may be made to the disclosed embodiments while remaining within the scope of the invention as defined by the following claims.

What is claimed is:

1. A flash memory with a flexible erasing size comprising:

a first bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline;

a second bank of flash transistors forming a plurality of rows and a plurality of columns, each transistor having a gate, drain and source, where the gates of transistors in each row are coupled to common wordlines, the drains of transistors in each column are coupled to common bitlines and the sources of the transistors in the second bank are all coupled to a second sourceline;

a wordline decoder coupled to said wordlines and configured to receive a wordline address signal and to decode said wordline address signal to select a wordline, said wordline decoder including a wordline latch configured to latch said selected wordline;

a sourceline decoder coupled to said sourcelines and configured to receive a sourceline address signal and to decode said sourceline address signal to select a sourceline, said sourceline decoder including a sourceline latch configured to latch said selected sourceline; and a bitline decoder coupled to said bitlines and configured to receive a bitline address signal and to decode said bitline address signal to latch a selected bitline, said bitline decoder including a bitline latch configured to latch said selected bitline.

2. The flash memory of claim 1, wherein:

said wordline decoder is configured to provide a wordline erase voltage on a latched wordline in response to an erase signal, said sourceline decoder is configured to provide a sourceline erase voltage on a latched sourceline in response to said erase signal and said bitline decoder is configured to provide a bitline erase voltage on a latched bitline in response to said erase signal.

3. The flash memory of claim 2, wherein:

said wordline latch is configured to reset in response to a read signal;

said sourceline latch is configured to reset in response to a read signal; and said bitline latch is configured to reset in response to a read signal.

4. The flash memory of claim 2, wherein:

said wordline decoder is configured to provide a wordline erase voltage on all wordlines in response to an erase all signal, said sourceline decoder is configured to provide a sourceline erase voltage on all sourcelines in response to said erase all signal and said bitline decoder is configured to provide a bitline erase voltage on all bitlines in response to said erase all signal.

5. A method of providing a flexible erase in a flash memory having a first bank of flash transistors with a plurality of wordlines, bitlines and a first sourceline, and a second bank of flash transistors with a plurality of wordlines, bitlines and a second sourceline, said method comprising the steps of:

receiving an address representing a portion of memory requested to be erased;

decoding said address to identify said portion in one of said first bank and said second bank;

latching a wordline corresponding to said portion in one of said first bank and said second bank;

latching a bitline corresponding to said portion in one of said first bank and said second bank;

latching a sourceline corresponding to said portion in one of said first bank and said second bank; and in response to an erase signal, performing the steps of:
(a) providing a wordline erase voltage to said latched wordline;
(b) providing a bitline erase voltage to said latched bitline; and
(c) providing a sourceline erase voltage to said latched sourceline.

6. The method of claim 5, further comprising the step of:

in response to an erase signal, performing the steps of:
(a) providing a wordline erase voltage to said latched wordline;
(b) providing a bitline erase voltage to said latched bitline; and
(c) providing a sourceline erase voltage to said latched sourceline.

7. The method of claim 6, further comprising the step of:

in response to a read signal, performing the steps of:
(a) resetting said latched wordline;
(b) resetting said latched bitline; and
(c) resetting said latched sourceline.

8. The method of claim 6, wherein:

in response to an erase all signal, performing the steps of:
(a) providing a wordline erase voltage to all wordlines;
(b) providing a bitline erase voltage to all bitlines; and
(c) providing a sourceline erase voltage to all sourcelines.

9. A method of manufacturing a flash memory comprising the steps of:

forming a first bank of flash transistors having a plurality of rows and a plurality of columns, each transistor having a gate, drain and source, where the gates of transistors in each row are coupled to common wordlines, the drains of transistors in each column are coupled to common bitlines and the sources of the transistors in the first bank are all coupled to a first sourceline;

forming a second bank of flash transistors having a plurality of rows and a plurality of columns, each transistor having a gate, drain and source, where the gates of transistors in each row are coupled to common wordlines, the drains of transistors in each column are coupled to common bitlines and the sources of the transistors in the second bank are all coupled to a second sourceline;

coupling a wordline decoder having a wordline latch to said wordlines;

coupling a sourceline decoder having a sourceline latch to said first sourceline and said second sourceline; and coupling a bitline decoder having a bitline latch to said bitlines.

10. The method of claim 9, further comprising the step of:

coupling a sense amplifier to said bitline decoder.

11. The method of claim 10, further comprising the step of:

coupling a sequencer to said bitline decoder.

* * * * *